United States Patent
Kim

(10) Patent No.: US 10,910,022 B1
(45) Date of Patent: Feb. 2, 2021

(54) SEMICONDUCTOR DEVICES

(71) Applicant: SK hynix Inc., Icheon-si (KR)

(72) Inventor: Kyung Mook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/839,800

(22) Filed: Apr. 3, 2020

(30) Foreign Application Priority Data

Nov. 18, 2019 (KR) .................. 10-2019-0148124

(51) Int. Cl.
| | |
|---|---|
| G11C 8/00 | (2006.01) |
| G11C 7/10 | (2006.01) |
| G11C 7/22 | (2006.01) |
| G11C 7/12 | (2006.01) |
| G11C 8/12 | (2006.01) |

(52) U.S. Cl.
CPC ............ G11C 7/1012 (2013.01); G11C 7/106 (2013.01); G11C 7/1063 (2013.01); G11C 7/1069 (2013.01); G11C 7/12 (2013.01); G11C 7/222 (2013.01); G11C 8/12 (2013.01)

(58) Field of Classification Search
CPC ..... G11C 7/1012; G11C 7/106; G11C 7/1063; G11C 7/1069; G11C 7/12; G11C 7/222; G11C 8/12

USPC ........................................................ 365/203
See application file for complete search history.

(56) References Cited

U.S. PATENT DOCUMENTS

| | | | |
|---|---|---|---|
| 7,965,570 B2 | 6/2011 | Wilson et al. | |
| 2004/0120210 A1* | 6/2004 | Lee ..................... | G11C 11/4076 365/232 |
| 2010/0110813 A1* | 5/2010 | Wilson ................. | G11C 7/1078 365/203 |

FOREIGN PATENT DOCUMENTS

KR          1020110047894 A     5/2011

* cited by examiner

*Primary Examiner* — Xiaochun L Chen
(74) *Attorney, Agent, or Firm* — William Park & Associates Ltd.

(57) ABSTRACT

A semiconductor device includes a shift control circuit and a synthesis pre-charge signal generation circuit. The shift control circuit generates a shift signal and a shift read signal based on a read command and controls a reset status of the shift read signal based on the shift signal and an auto-pre-charge command. The synthesis pre-charge signal generation circuit generates a synthesis pre-charge signal for an auto-pre-charge operation of a bank selected by an address based on the shift read signal and the address.

20 Claims, 9 Drawing Sheets

SEMICONDUCTOR DEVICES

CROSS-REFERENCE TO RELATED APPLICATIONS

The present application claims priority under 35 U.S.C 119(a) to Korean Application No. 10-2019-0148124, filed on Nov. 18, 2019, which is incorporated herein by reference in its entirety.

BACKGROUND

1. Technical Field

Embodiments of the present disclosure relate to semiconductor devices performing a pre-charge operation.

2. Related Art

Semiconductor devices may perform a pre-charge operation to pre-charge bit lines after a read operation or a write operation of the semiconductor devices is executed. The pre-charge operation may be performed using a method generating a pre-charge command based on a command and a method automatically generating an auto-pre-charge command for the pre-charge operation when a command for the read operation or the write operation is generated.

SUMMARY

According to an embodiment, a semiconductor device includes a shift control circuit and a synthesis pre-charge signal generation circuit. The shift control circuit is configured to generate a shift signal and a shift read signal based on a read command and configured to control a reset status of the shift read signal based on the shift signal and an auto-pre-charge command. The synthesis pre-charge signal generation circuit is configured to generate a synthesis pre-charge signal for an auto-pre-charge operation of a bank selected by an address based on the shift read signal and the address.

According to another embodiment, a semiconductor device includes a shift read signal generation circuit, a shift reset signal generation circuit, and a synthesis pre-charge signal generation circuit. The shift read signal generation circuit is configured to shift a read command to generate a shift signal and a shift read signal. The shift reset signal generation circuit is configured to latch an auto-pre-charge command based on the shift signal to generate a shift reset signal for resetting the shift read signal. The synthesis pre-charge signal generation circuit is configured to generate a synthesis pre-charge signal for an auto-pre-charge operation of a bank selected by an address based on the shift read signal and the address.

DETAILED DESCRIPTION OF THE EMBODIMENTS

In the following description of the embodiments, when a parameter is referred to as being "predetermined," it may be intended to mean that a value of the parameter is determined in advance of when the parameter is used in a process or an algorithm. The value of the parameter may be set when the process or the algorithm starts or may be set during a time period over which the process or the algorithm is executed.

It will be understood that although the terms "first," "second," "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or one or more intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to embodiments. For example, a certain signal having a logic "high" level in one embodiment may be set to have a logic "low" level in another embodiment.

Various embodiments of the present disclosure are described hereinafter in detail with reference to the accompanying drawings. However, the described embodiments are for illustrative purposes only and are not intended to limit the scope of the present disclosure.

Figure 1:
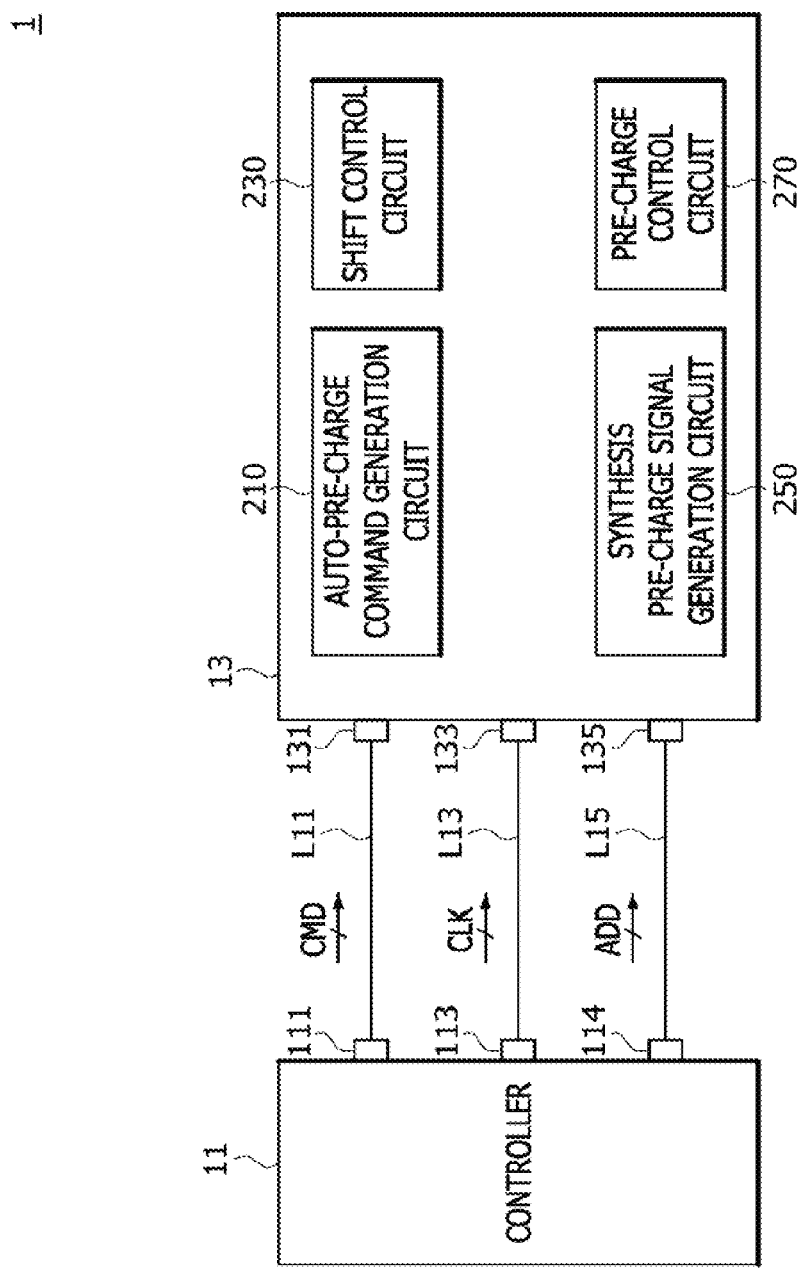
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 11 and a semiconductor device 13. The semiconductor device 13 may include an auto-pre-charge command generation circuit 210, a shift control circuit 230, a synthesis pre-charge signal generation circuit 250, and a pre-charge control circuit 270.

The controller 11 may include a first control pin 111, a second control pin 113, and a third control pin 114. The semiconductor device 13 may include a first semiconductor pin 131, a second semiconductor pin 133, and a third semiconductor pin 135. The first control pin 111 may be connected to the first semiconductor pin 131 through a first transmission line L11. The second control pin 113 may be connected to the second semiconductor pin 133 through a second transmission line L13. The third control pin 114 may be connected to the third semiconductor pin 135 through a third transmission line L15. The controller 11 may transmit a command CMD to the semiconductor device 13 through the first transmission line L11 to control the semiconductor device 13. The controller 11 may transmit a clock signal CLK to the semiconductor device 13 through the second transmission line L13 to control the semiconductor device 13. The controller 11 may transmit an address ADD to the semiconductor device 13 through the third transmission line L15 to control the semiconductor device 13.

The auto-pre-charge command generation circuit 210 may generate an auto-pre-charge command (APCG of FIG. 2) for performing a read operation accompanying an auto-pre-charge operation when an auto-pre-charge flag (AP_F of FIG. 2) is generated to perform the auto-pre-charge operation while a read command (RCMD of FIG. 2) is generated to perform the read operation.

The shift control circuit 230 may generate a shift read signal (SFT_RD of FIG. 2) when the auto-pre-charge command APCG is generated and may reset the shift read signal SFT_RD according to a shift reset signal (SFT_RST of FIG. 2) when the auto-pre-charge command APCG is not generated.

The synthesis pre-charge signal generation circuit 250 may generate a synthesis pre-charge signal (S_BK of FIG. 2) for the auto-pre-charge operation of a bank (not shown) selected by the address ADD when the shift read signal SFT_RD is generated. For some embodiments, a bank refers to a memory bank. The synthesis pre-charge signal generation circuit 250 may generate the synthesis pre-charge signal S_BK when a bank pre-charge signal (P_BK of FIG. 2) is generated while the shift read signal SFT_RD is not generated. The bank pre-charge signal P_BK may be generated for a pre-charge operation of a bank (not shown) selected by the address ADD according to a pre-charge command.

The pre-charge control circuit 270 may control the pre-charge operation based on the synthesis pre-charge signal S_BK. The pre-charge control circuit 270 may control the auto-pre-charge operation or the pre-charge operation of a bank selected by the address ADD when the synthesis pre-charge signal S_BK is generated.

Figure 2:
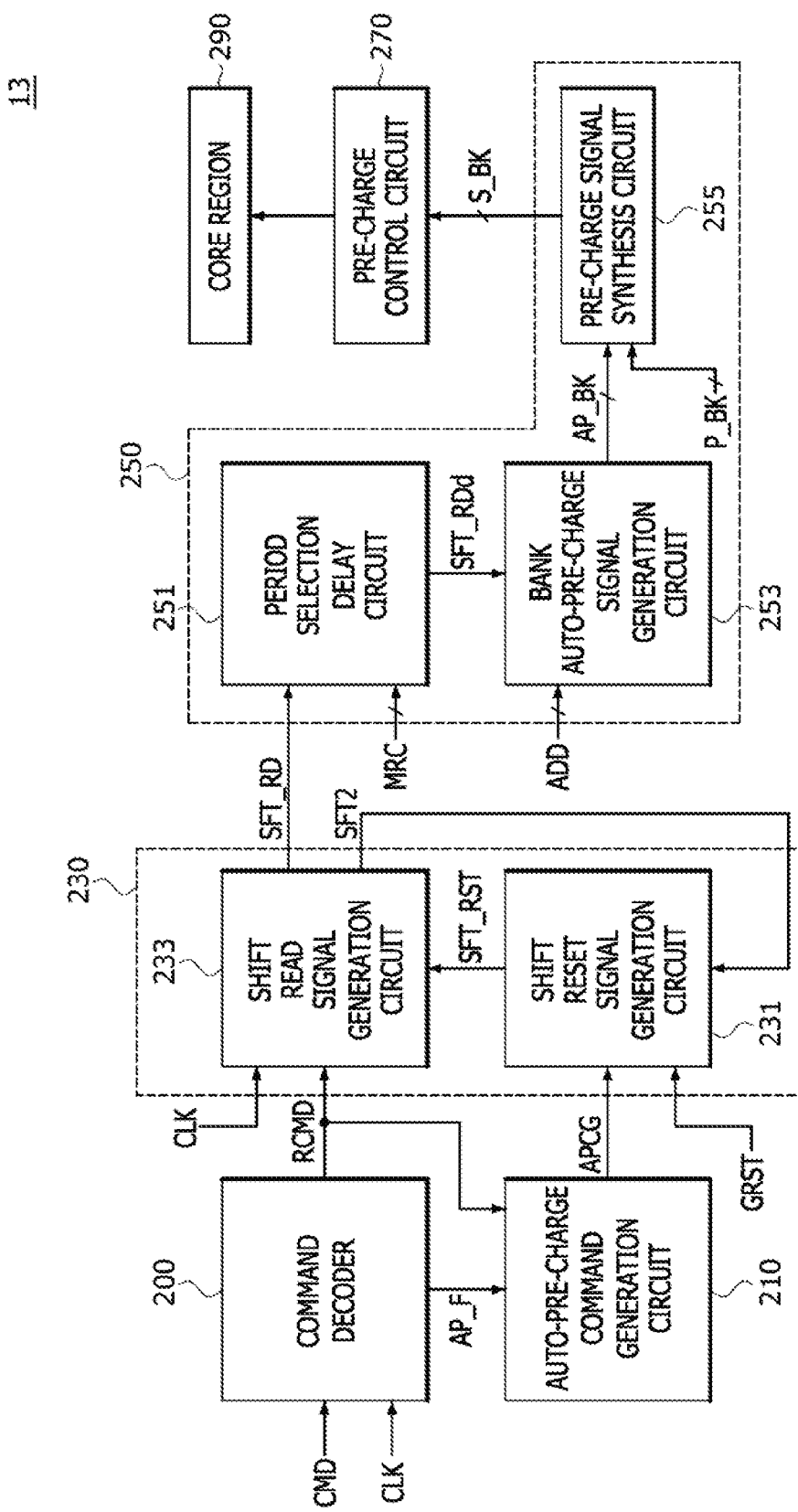
FIG. 2 is a block diagram illustrating a configuration of a semiconductor device included in the semiconductor system of FIG. 1.

FIG. 2 is a block diagram illustrating a configuration of the semiconductor device 13. As illustrated in FIG. 2, the semiconductor device 13 may include a command decoder 200, the auto-pre-charge command generation circuit 210, the shift control circuit 230, the synthesis pre-charge signal generation circuit 250, the pre-charge control circuit 270, and a core region 290.

The command decoder 200 may generate the read command RCMD and the auto-pre-charge flag AP_F based on the clock signal CLK and the command CMD. The command decoder 200 may decode the command CMD in synchronization with the clock signal CLK to generate the read command RCMD and the auto-pre-charge flag AP_F. The read command RCMD may be generated to perform the read operation. The auto-pre-charge flag AP_F may be generated to perform the auto-pre-charge operation. The read command RCMD may be generated while bits included in the command CMD received in synchronization with the clock signal CLK are set to have a predetermined logic level combination. The auto-pre-charge flag AP_F may be generated by at least one of the bits included in the command CMD received in synchronization with the clock signal CLK.

The auto-pre-charge command generation circuit 210 may generate the auto-pre-charge command APCG based on the read command RCMD and the auto-pre-charge flag AP_F. The auto-pre-charge command generation circuit 210 may generate the auto-pre-charge command APCG for performing the read operation accompanying the auto-pre-charge operation when the read command RCMD is generated to perform the read operation and the auto-pre-charge flag AP_F is generated to perform the auto-pre-charge operation.

The shift control circuit 230 may generate a second shift signal SFT2 and the shift read signal SFT_RD when the auto-pre-charge command APCG is generated and may reset the shift read signal SFT_RD according to the shift reset signal SFT_RST when the auto-pre-charge command APCG is not generated. The shift control circuit 230 may include a shift reset signal generation circuit 231 and a shift read signal generation circuit 233.

The shift reset signal generation circuit 231 may generate the shift reset signal SFT_RST based on the second shift signal SFT2 and the auto-pre-charge command APCG. The shift reset signal generation circuit 231 may be configured not to generate the shift reset signal SFT_RST if the auto-pre-charge command APCG is generated when the second shift signal SFT2 is generated. The shift reset signal generation circuit 231 may be configured to generate the shift reset signal SFT_RST if the auto-pre-charge command APCG is not generated when the second shift signal SFT2 is generated. The shift reset signal generation circuit 231 may reset the shift reset signal SFT_RST when a reset signal GRST is generated. The reset signal GRST may be generated to reset the semiconductor device 13.

The shift read signal generation circuit 233 may generate the second shift signal SFT2 and the shift read signal SFT_RD from the read command RCMD based on the shift reset signal SFT_RST and the clock signal CLK. The shift read signal generation circuit 233 may shift the read command RCMD using the clock signal CLK to generate the second shift signal SFT2 and the shift read signal SFT_RD while the shift reset signal SFT_RST is not generated. The shift read signal generation circuit 233 may reset the second shift signal SFT2 and the shift read signal SFT_RD when the shift reset signal SFT_RST is generated.

The synthesis pre-charge signal generation circuit 250 may generate the synthesis pre-charge signal S_BK for the auto-pre-charge operation of a bank selected by the address ADD when the shift read signal SFT_RD is generated. The synthesis pre-charge signal generation circuit 250 may generate the synthesis pre-charge signal S_BK when the shift read signal SFT_RD is not generated and the bank pre-charge signal P_BK is generated. The synthesis pre-charge signal generation circuit 250 may generate the synthesis pre-charge signal S_BK regardless of the auto-pre-charge command APCG when the auto-pre-charge command APCG is not generated and the pre-charge command is generated. The synthesis pre-charge signal generation circuit 250 may include a period selection delay circuit 251, a bank auto-pre-charge signal generation circuit 253, and a pre-charge signal synthesis circuit 255. The pre-charge command may be generated by decoding command CMD in the command decoder 200.

The period selection delay circuit 251 may delay the shift read signal SFT_RD by a delay time set by a mode register code MRC to generate a delayed shift read signal SFT_RDd. The mode register code MRC may be stored in a mode register (not shown) by a mode register set. The mode register code MRC may include bits having a logic level combination corresponding to a read-to-pre-charge time tRTP. The read-to-pre-charge time tRTP may be an index that indicates a time period between an end point of the read operation and a start point of the pre-charge operation using a cycle of the clock signal CLK.

The bank auto-pre-charge signal generation circuit 253 may generate a bank auto-pre-charge signal AP_BK based on the address ADD and the delayed shift read signal SFT_RDd. The bank auto-pre-charge signal generation circuit 253 may generate the bank auto-pre-charge signal AP_BK for the auto-pre-charge operation of a bank selected by the address ADD when the delayed shift read signal SFT_RDd is generated.

The pre-charge signal synthesis circuit 255 may generate the synthesis pre-charge signal S_BK based on the bank auto-pre-charge signal AP_BK and the bank pre-charge signal P_BK. The pre-charge signal synthesis circuit 255 may generate the synthesis pre-charge signal S_BK when the bank auto-pre-charge signal AP_BK or the bank pre-charge signal P_BK is generated. The bank pre-charge signal P_BK may be generated to control the pre-charge operation of a bank selected by the address ADD when the pre-charge command (not shown) is generated.

The pre-charge control circuit 270 may control the pre-charge operation of the core region 290 based on the synthesis pre-charge signal S_BK. The core region 290 may include a plurality of banks (not shown), one of which is selected by the address ADD. The pre-charge control circuit 270 may control the auto-pre-charge operation or the pre-charge operation of a bank selected by the address ADD among the plurality of banks included in the core region 290 when the synthesis pre-charge signal S_BK is generated.

Figure 3:
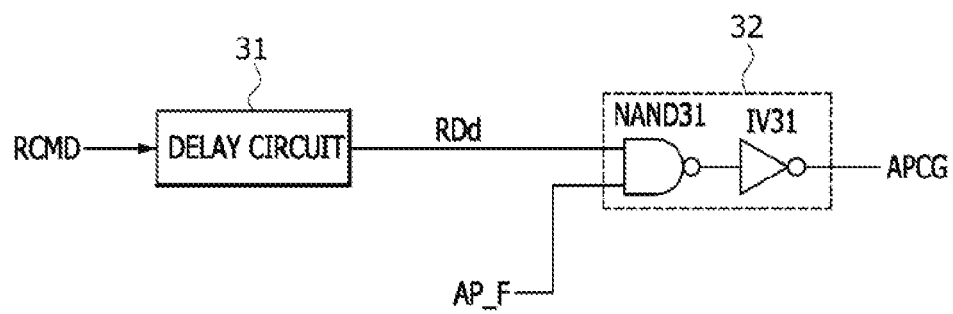
FIG. 3 illustrates a configuration of an auto-pre-charge command generation circuit included in the semiconductor device of FIG. 2.

FIG. 3 illustrates a configuration of the auto-pre-charge command generation circuit 210. As illustrated in FIG. 3, the auto-pre-charge command generation circuit 210 may include a delay circuit 31 and a command output circuit 32.

The delay circuit 31 may delay the read command RCMD by a predetermined time period to generate a delayed read command RDd. The command output circuit 32 may include a NAND gate NAND31 and an inverter IV31 coupled in series to perform a logical AND operation. The command output circuit 32 may perform a logical AND operation of the delayed read command RDd and the auto-pre-charge flag AP_F to generate the auto-pre-charge command APCG. The auto-pre-charge command generation circuit 210 may generate the auto-pre-charge command APCG having a logic "high" level when the auto-pre-charge flag AP_F is generated to have a logic "high" level while the read command RCMD is generated to have a logic "high" level. A logic level of the auto-pre-charge command APCG for performing the read operation accompanying the auto-pre-charge operation may be set to be different according to the embodiments. Logic levels of the read command RCMD and the auto-pre-charge flag AP_F for generating the auto-pre-charge command APCG may be set to be different according to the embodiments.

Figure 4:
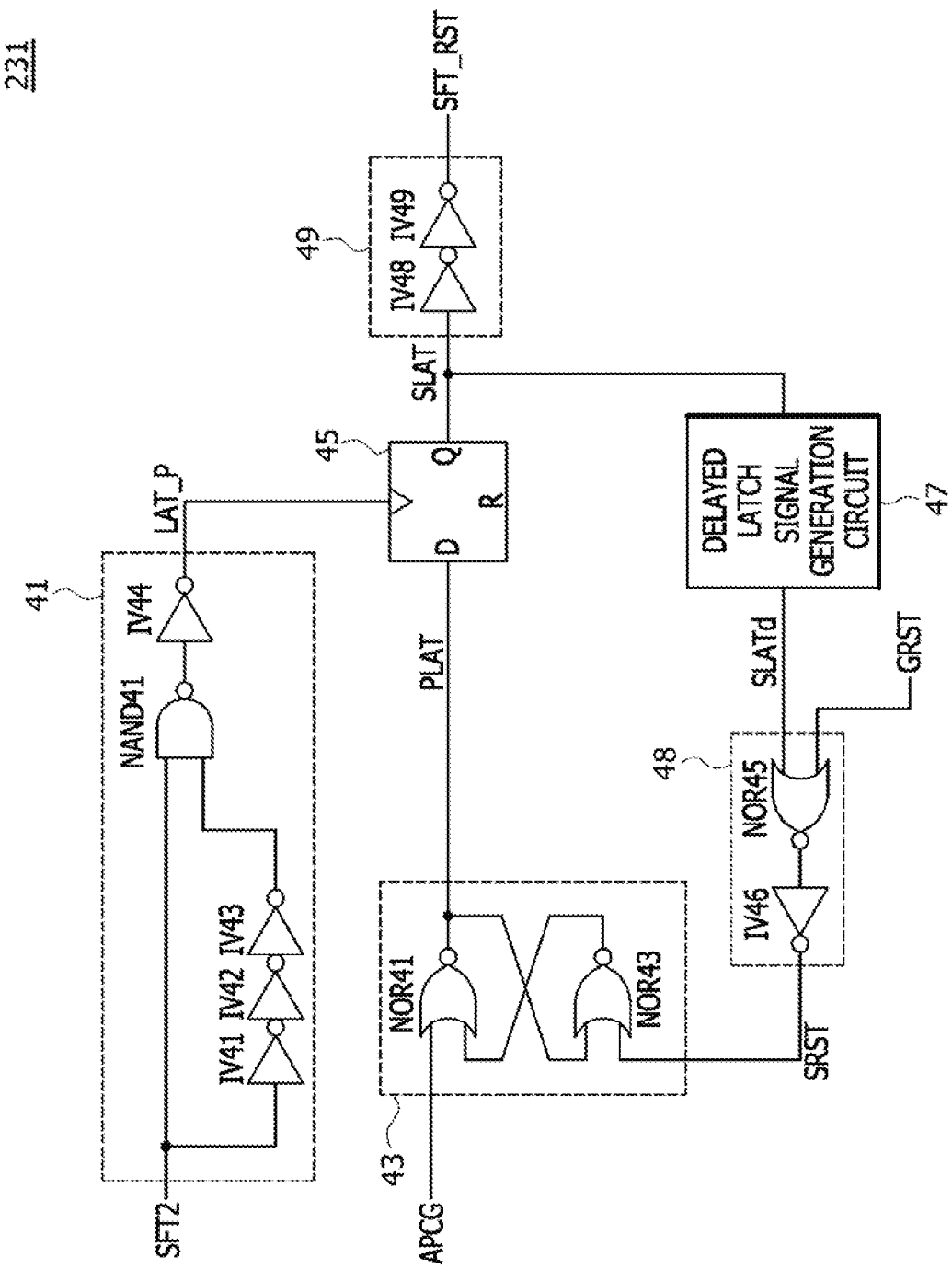
FIG. 4 illustrates a configuration of a shift reset signal generation circuit included in the semiconductor device of FIG. 2.

FIG. 4 illustrates a configuration of the shift reset signal generation circuit 231. As illustrated in FIG. 4, the shift reset signal generation circuit 231 may include a latch pulse generation circuit 41, a pre-command latch 43, a command latch 45, a delayed latch signal generation circuit 47, a reset signal synthesis circuit 48, and a reset signal output circuit 49.

The latch pulse generation circuit 41 may include inverters IV41, IV42, IV43, and IV44 and a NAND gate NAND41. The inverters IV41, IV42, and IV43 may be coupled in series to inversely buffer the second shift signal SFT2 and to output the inversely buffered signal of the second shift signal SFT2. The NAND gate NAND41 and the inverter IV44 may perform a logical AND operation of the second shift signal SFT2 and an output signal of the inverters IV41, IV42, and IV43 to generate a latch pulse LAT_P. The latch pulse generation circuit 41 may generate the latch pulse LAT_P having a pulse width corresponding to a delay time of the inverters IV41, IV42, and IV43 when the second shift signal SFT2 is generated to have a logic "high" level.

The pre-command latch 43 may include NOR gates NOR41 and NOR43. The NOR gate NOR41 may receive the auto-pre-charge command APCG and an output signal of the NOR gate NOR43 to perform a logical NOR operation of the auto-pre-charge command APCG and an output signal of the NOR gate NOR43 to generate a pre-latch signal PLAT. The NOR gate NOR43 may receive a synthesis reset signal SRST and an output signal of the NOR gate NOR41 to perform a logical NOR operation of the synthesis reset signal SRST and an output signal of the NOR gate NOR41. The pre-command latch 43 may generate the pre-latch signal PLAT having a logic "low" level when the auto-pre-charge command APCG has a logic "high" level. The pre-command latch 43 may reset the pre-latch signal PLAT to a logic "low" level when the synthesis reset signal SRST is generated to have a logic "high" level.

The command latch 45 may be realized using a D flip-flop and may generate a latch signal SLAT from the pre-latch signal PLAT based on the latch pulse LAT_P. The command latch 45 may latch the pre-latch signal PLAT to output the latched signal of the pre-latch signal PLAT as the latch signal SLAT when the latch pulse LAT_P is generated to have a logic "high" level.

The delayed latch signal generation circuit 47 may delay the latch signal SLAT to generate a delayed latch signal SLATd. A delay time of the delayed latch signal generation circuit 47 may be set to be different according to the embodiments.

The reset signal synthesis circuit 48 may include a NOR gate NOR45 and an inverter IV46 which are coupled in series. The reset signal synthesis circuit 48 may perform a logical OR operation of the delayed latch signal SLATd and the reset signal GRST to generate the synthesis reset signal SRST. The synthesis reset signal SRST may generate the synthesis reset signal SRST having a logic "high" level when the latch signal SLAT is generated to have a logic "high" level and a delay time of the delayed latch signal generation circuit 47 elapses or when the reset signal GRST is generated to have a logic "high" level.

The reset signal output circuit 49 may include inverters IV48 and IV49 which are coupled in series. The reset signal output circuit 49 may buffer the latch signal SLAT to generate the shift reset signal SFT_RST.

The shift reset signal generation circuit 231 having the aforementioned configuration may latch the auto-pre-charge command APCG at a time when the latch pulse LAT_P generated by shifting the read command RCMD is created, thereby generating the shift reset signal SFT_RST for resetting the shift read signal SFT_RD. The shift reset signal generation circuit 231 may reset the shift read signal SFT_RD to control the pre-charge operation regardless of the auto-pre-charge command APCG when the auto-pre-charge command APCG is not generated.

Figure 5:
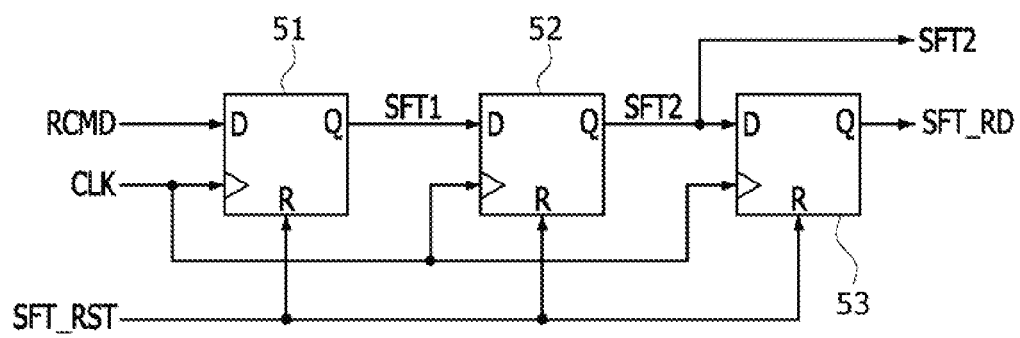
FIG. 5 is a circuit diagram illustrating a configuration of a shift read signal generation circuit included in the semiconductor device of FIG. 2.

FIG. 5 is a circuit diagram illustrating a configuration of the shift read signal generation circuit 233. As illustrated in FIG. 5, the shift read signal generation circuit 233 may include D flip-flops 51, 52, and 53.

The D flip-flop 51 may be synchronized with the clock signal CLK to latch the read command RCMD and may output the latched read command as a first shift signal SFT1. The D flip-flop 51 may shift the read command RCMD by one cycle of the clock signal CLK to generate the first shift signal SFT1. The D flip-flop 51 may reset the first shift signal SFT1 to a logic "low" level when the shift reset signal SFT_RST is generated to have a logic "high" level. The D flip-flop 52 may be synchronized with the clock signal CLK to latch the first shift signal SFT1 and may output the latched signal of the first shift signal SFT1 as the second shift signal SFT2. The D flip-flop 52 may shift the first shift signal SFT1 by one cycle of the clock signal CLK to generate the second shift signal SFT2. The D flip-flop 52 may reset the second shift signal SFT2 to a logic "low" level when the shift reset signal SFT_RST is generated to have a logic "high" level. The D flip-flop 53 may be synchronized with the clock signal CLK to latch the second shift signal SFT2 and may output the latched signal of the second shift signal SFT2 as the shift read signal SFT_RD. The D flip-flop 53 may shift the second shift signal SFT2 by one cycle of the clock signal CLK to generate the shift read signal SFT_RD. The D flip-flop 53 may reset the shift read signal SFT_RD to a logic "low" level when the shift reset signal SFT_RST is generated to have a logic "high" level.

The shift read signal generation circuit 233 having the aforementioned configuration may shift the read command RCMD by one cycle of the clock signal CLK to generate the first shift signal SFT1, may shift the read command RCMD by two cycles of the clock signal CLK to generate the second shift signal SFT2, and may shift the read command RCMD by three cycles of the clock signal CLK to generate the shift read signal SFT_RD.

Figure 6:
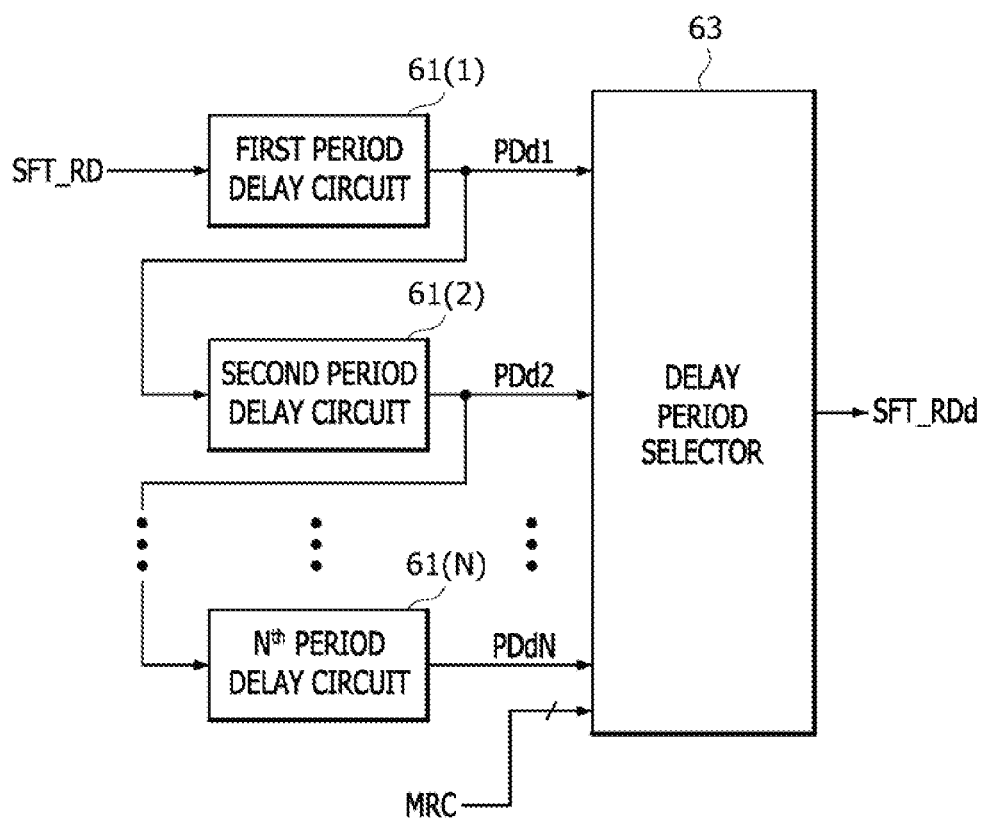
FIG. 6 is a block diagram illustrating a configuration of a period selection delay circuit included in the semiconductor device of FIG. 2.

FIG. 6 is a block diagram illustrating a configuration of the period selection delay circuit 251. As illustrated in FIG. 6, the period selection delay circuit 251 may include first to $N^{th}$ period delay circuits 61(1)-61(N) and a delay period selector 63.

The first period delay circuit 61(1) may delay the shift read signal SFT_RD by a unit period to generate a first period signal PDd1. The unit period may be set to be different according to the embodiments. The second period delay circuit 61(2) may delay the first period signal PDd1 by the unit period to generate a second period signal PDd2. The $N^{th}$ period delay circuit 61(N) may delay a $(N-1)^{th}$ period signal PDd(N-1) by the unit period to generate an $N^{th}$ period signal PDdN. The delay period selector 63 may select and output one of the first to $N^{th}$ period signals PDd1-PDdN as the delayed shift read signal SFT_RDd based on the mode register code MRC. The delay period selector 63 may delay the shift read signal SFT_RD by the read-to-pre-charge time tRTP corresponding to the mode register code MRC to generate the delayed shift read signal SFT_RDd.

Figure 7:
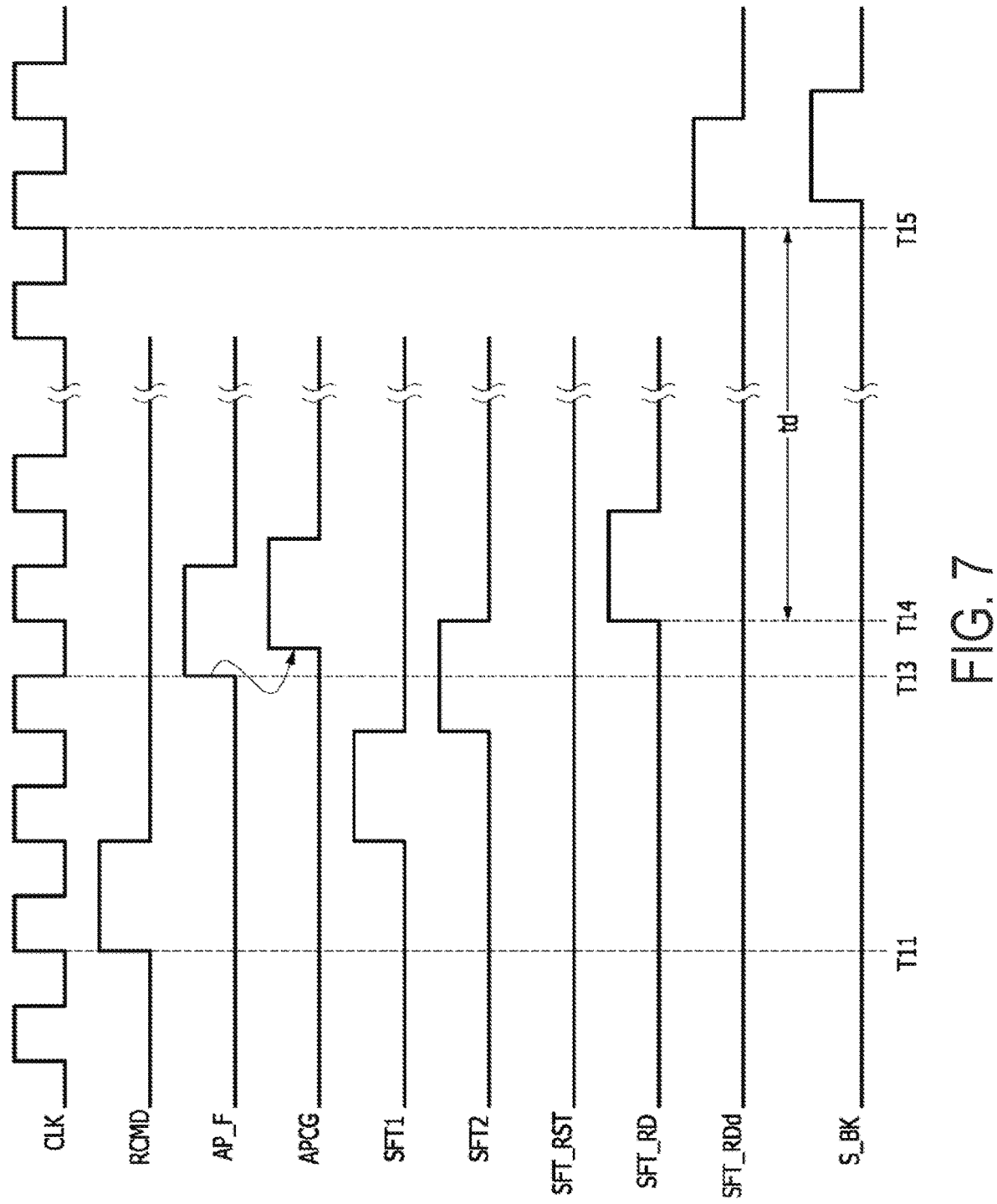
FIGS. 7 and 8 are timing diagrams illustrating operations of the semiconductor device shown in FIG. 2.
Figure 8:
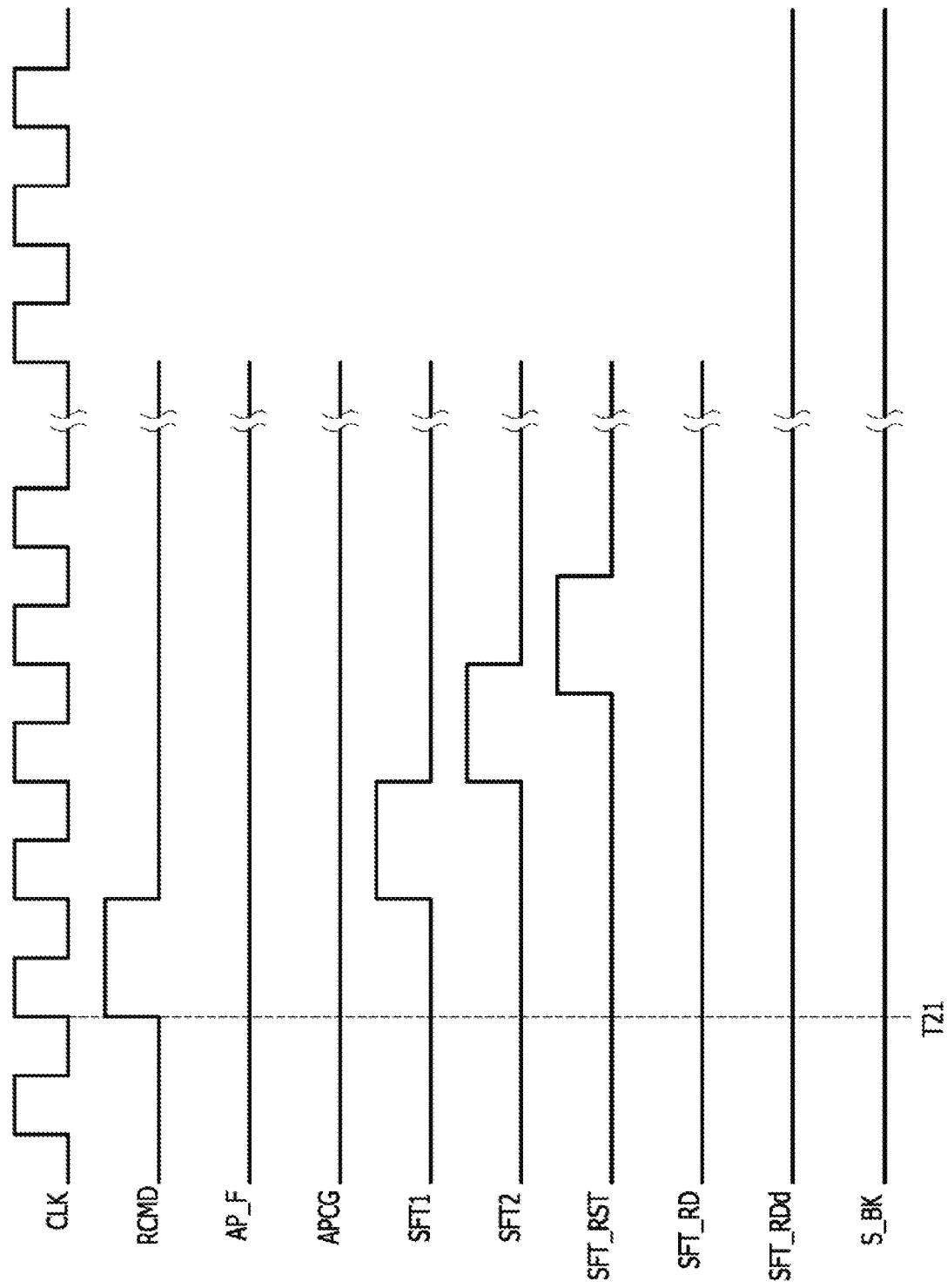

FIGS. 7 and 8 are timing diagrams illustrating operations of the semiconductor device 13.

As illustrated in FIG. 7, when the read command RCMD is generated at a time "T11" and the auto-pre-charge flag AP_F is created at a time "T13," the auto-pre-charge command APCG may be generated to perform the read operation accompanying the auto-pre-charge operation. The read command RCMD may be shifted by the clock signal CLK to sequentially generate the first shift signal SFT1 and the second shift signal SFT2. Because the auto-pre-charge command APCG is generated while the second shift signal SFT2 is generated, the shift reset signal SFT_RST is not generated. Thus, the second shift signal SFT2 may be shifted by the clock signal CLK to generate the shift read signal SFT_RD. The delayed shift read signal SFT_RDd may be generated at a time "T15" when a time period 'td' corresponding to the read-to-pre-charge time tRTP elapses from a time "T14" when the shift read signal SFT_RD is generated. The synthesis pre-charge signal S_BK for the auto-pre-charge operation of a bank selected by the address ADD may be generated when the delayed shift read signal SFT_RDd is generated.

As illustrated in FIG. 8, when the read command RCMD is generated at a time "T21" and the auto-pre-charge flag AP_F is not created, the auto-pre-charge command APCG is not generated. The read command RCMD may be shifted by the clock signal CLK to sequentially generate the first shift signal SFT1 and the second shift signal SFT2. Because the auto-pre-charge command APCG is not generated while the second shift signal SFT2 is generated, the shift reset signal SFT_RST may be generated. If the shift reset signal SFT_RST is generated, the delayed shift read signal SFT_RDd and the synthesis pre-charge signal S_BK are not generated because the shift read signal SFT_RD is reset.

As described above, the semiconductor device 13 may shift the read command RCMD to generate the shift read signal SFT_RD in order to discriminate whether the auto-pre-charge command APCG is generated and may immediately reset the delayed shift read signal SFT_RDd when the auto-pre-charge command APCG is not generated. Thus, it may be possible to promptly interrupt an operation that the synthesis pre-charge signal S_BK is generated by the auto-pre-charge command APCG. In addition, the semiconductor device 13 may control the execution of the auto-pre-charge operation according to the pre-charge command regardless of the auto-pre-charge command APCG when the auto-pre-charge command APCG is regarded as not being generated by the shift read signal SFT_RD.

Although the present embodiment is described in conjunction with a case in which the semiconductor device 13 controls the auto-pre-charge operation during the read operation accompanying the auto-pre-charge operation, the present disclosure is not limited thereto. For example, in some other embodiments, the semiconductor device 13 may be realized to control the auto-pre-charge operation during a write operation accompanying the auto-pre-charge operation.

Figure 9:
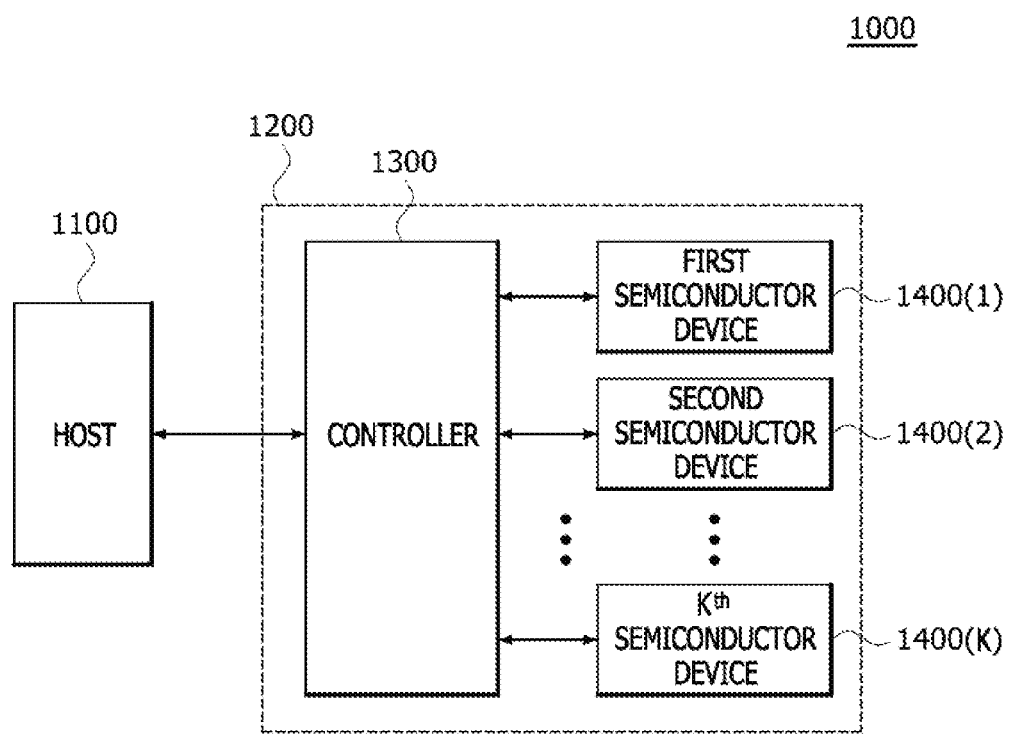
FIG. 9 is a block diagram illustrating a configuration of an electronic system employing a semiconductor device according to an embodiment of the present disclosure.

FIG. 9 is a block diagram illustrating a configuration of an electronic system 1000 including the semiconductor device 13. As illustrated in FIG. 9, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols, such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The semiconductor devices 1400(K:1) and semiconductor devices 1400

(1:K) are only differences in the method of entry, but have the same meaning. The controller 1300 may control the semiconductor devices 1400(K:1) such that the semiconductor devices 1400(K:1) perform the read operation accompanying the auto-pre-charge operation or the write operation accompanying the auto-pre-charge operation. Each of the semiconductor devices 1400(K:1) may immediately interrupt an operation for generating the synthesis pre-charge signal S_BK according to the auto-pre-charge command APCG when the auto-pre-charge command APCG is not generated.

The controller 1300 may be realized using the controller 11 illustrated in FIG. 1. Each of the semiconductor devices 1400(K:1) may be realized using the semiconductor device 13 illustrated in FIGS. 1 and 2. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
   a shift control circuit configured to generate a shift signal and a shift read signal based on a read command and configured to control a reset status of the shift read signal based on the shift signal and an auto-pre-charge command; and
   a synthesis pre-charge signal generation circuit configured to generate a synthesis pre-charge signal for an auto-pre-charge operation of a bank selected by an address based on the shift read signal and the address.

2. The semiconductor device of claim 1, further comprising a command decoder configured to generate the read command by decoding a command.

3. The semiconductor device of claim 1, further comprising an auto-pre-charge command generation circuit configured to generate the auto-pre-charge command based on an auto-pre-charge flag while the read command is generated.

4. The semiconductor device of claim 1,
   wherein the shift control circuit comprises a shift read signal generation circuit configured to shift the read command to generate the shift signal and the shift read signal, and
   wherein the shift signal and the shift read signal are reset when a shift reset signal is generated.

5. The semiconductor device of claim 1, wherein the shift control circuit comprises a shift reset signal generation circuit configured to latch the auto-pre-charge command based on the shift signal to generate a shift reset signal.

6. The semiconductor device of claim 5, wherein the shift reset signal generation circuit comprises:
   a pre-command latch configured to latch the auto-pre-charge command to generate a pre-latch signal; and
   a command latch configured to latch the pre-latch signal in synchronization with a latch pulse generated based on the shift signal to generate a latch signal.

7. The semiconductor device of claim 6, wherein the shift reset signal generation circuit further comprises a reset signal synthesis circuit configured to generate a synthesis reset signal for resetting the pre-latch signal based on the latch signal and a reset signal.

8. The semiconductor device of claim 1, wherein the synthesis pre-charge signal generation circuit comprises a period selection delay circuit configured to delay the shift read signal based on a mode register code to generate a delayed shift read signal.

9. The semiconductor device of claim 8, wherein the mode register code is set by a mode register set to delay the shift read signal by a period corresponding to a read-to-pre-charge time.

10. The semiconductor device of claim 8, wherein the synthesis pre-charge signal generation circuit further comprises:
    a bank auto-pre-charge signal generation circuit configured to generate a bank auto-pre-charge signal based on the address and the delayed shift read signal; and
    a pre-charge signal synthesis circuit configured to generate the synthesis pre-charge signal based on the bank auto-pre-charge signal and a bank pre-charge signal.

11. The semiconductor device of claim 10, wherein the bank pre-charge signal is generated to perform a pre-charge operation for a bank selected by the address.

12. A semiconductor device comprising:
    a shift read signal generation circuit configured to shift a read command to generate a shift signal and a shift read signal;
    a shift reset signal generation circuit configured to latch an auto-pre-charge command based on the shift signal to generate a shift reset signal for resetting the shift read signal; and
    a synthesis pre-charge signal generation circuit configured to generate a synthesis pre-charge signal for an auto-pre-charge operation of a bank selected by an address based on the shift read signal and the address.

13. The semiconductor device of claim 12, further comprising a command decoder configured to generate the read command by decoding a command.

14. The semiconductor device of claim 12, further comprising an auto-pre-charge command generation circuit configured to generate the auto-pre-charge command based on an auto-pre-charge flag while the read command is generated.

15. The semiconductor device of claim 12, wherein the shift reset signal generation circuit comprises:
    a pre-command latch configured to latch the auto-pre-charge command to generate a pre-latch signal; and
    a command latch configured to latch the pre-latch signal in synchronization with a latch pulse generated based on the shift signal to generate a latch signal.

16. The semiconductor device of claim 15, wherein the shift reset signal generation circuit further comprises a reset signal synthesis circuit configured to generate a synthesis reset signal for resetting the pre-latch signal based on the latch signal and a reset signal.

17. The semiconductor device of claim 12, wherein the synthesis pre-charge signal generation circuit comprises a period selection delay circuit configured to delay the shift read signal based on a mode register code to generate a delayed shift read signal.

18. The semiconductor device of claim 17, wherein the mode register code is set by a mode register set to delay the shift read signal by a period corresponding to a read-to-pre-charge time.

19. The semiconductor device of claim 17, wherein the synthesis pre-charge signal generation circuit further comprises:
    a bank auto-pre-charge signal generation circuit configured to generate a bank auto-pre-charge signal based on the address and the delayed shift read signal; and
    a pre-charge signal synthesis circuit configured to generate the synthesis pre-charge signal based on the bank auto-pre-charge signal and a bank pre-charge signal.

20. The semiconductor device of claim 19, wherein the bank pre-charge signal is generated to perform a pre-charge operation for a bank selected by the address is inputted.

* * * * *